(12) United States Patent
Chen

(10) Patent No.: US 12,004,323 B2
(45) Date of Patent: Jun. 4, 2024

(54) DEVICES OF DRAWING OUT SURFACE HEAT OF ELECTRONIC COMPONENTS

(71) Applicant: Kuan Hung Chen, New Taipei (TW)

(72) Inventor: Kuan Hung Chen, New Taipei (TW)

( * ) Notice: Subject to any disclaimer, the term of this patent is extended or adjusted under 35 U.S.C. 154(b) by 183 days.

(21) Appl. No.: 17/842,396

(22) Filed: Jun. 16, 2022

(65) Prior Publication Data

US 2023/0292463 A1    Sep. 14, 2023

(30) Foreign Application Priority Data

Mar. 14, 2022 (TW) .................. 111109171

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20263* (2013.01); *H05K 7/20272* (2013.01)

(58) Field of Classification Search
CPC ..... G06F 1/203; G06F 1/206; H05K 7/20263; H05K 7/20272; H05K 7/20218; H05K 7/20409; H05K 7/20436
See application file for complete search history.

(56) References Cited

U.S. PATENT DOCUMENTS

| | | | | |
|---|---|---|---|---|
| 3,817,321 | A * | 6/1974 | VON Cube | H01L 24/01 165/170 |
| 6,729,383 | B1 * | 5/2004 | Cannell | H01L 23/473 257/E23.098 |
| 6,918,404 | B2 * | 7/2005 | Dias da Silva | B41J 2/17509 137/142 |
| 7,980,295 | B2 * | 7/2011 | Takamatsu | F28D 15/043 165/104.33 |
| 9,982,570 | B2 * | 5/2018 | Gaiser | F01K 23/10 |
| 10,480,865 | B2 * | 11/2019 | Rice | F28D 15/046 |
| 11,379,021 | B2 * | 7/2022 | Wang | G06F 1/203 |
| 2004/0042174 | A1 * | 3/2004 | Tomioka | G06F 1/203 361/679.53 |
| 2006/0012958 | A1 * | 1/2006 | Tomioka | G06F 1/203 361/699 |
| 2016/0299545 | A1 * | 10/2016 | May | G06F 1/187 |
| 2020/0174534 | A1 * | 6/2020 | Ganta Papa Rao Bala | G06F 1/181 |

\* cited by examiner

*Primary Examiner* — Anthony M Haughton
(74) *Attorney, Agent, or Firm* — Wang Law Firm, Inc.

(57) ABSTRACT

A device of drawing out surface heat of an electronic component includes a housing, a liquid inlet port, a liquid outlet port, a partition wall and flow guiding walls. The housing includes opposite a contact wall and a heat dissipating wall, and a side wall respectively connected to the contact wall and the heat dissipating wall. The liquid inlet port and the liquid outlet port are formed on the side wall. The partition wall is formed in the housing, and connected to inner surfaces of the contact wall, the heat dissipating wall and the side wall, to divide an interior of the housing into an inflow channel and an outflow channel. The flow guiding walls are respectively formed in the inflow channel and the out flow channel, and connected to the inner surface of the contact wall.

10 Claims, 5 Drawing Sheets

DEVICES OF DRAWING OUT SURFACE HEAT OF ELECTRONIC COMPONENTS

CROSS-REFERENCE TO RELATED APPLICATION

This application claims the priority of Taiwanese patent application No. 111109171, filed on Mar. 14, 2022, which is incorporated herewith by reference.

BACKGROUND OF THE INVENTION

1. Field of the Invention

The present application relates to a device for contacting and conducting heat generated by an electronic component, especially to a device of drawing out surface heat of an electronic component.

2. The Prior Arts

Due to trends of shrinking size and improving functions of computer devices such as personal computers, cloud servers, automotive electronic products, heat densities of electronic components (such as central processing unit CPU, graphic processing unit GPU, communication circuits, power circuits, etc.) are increasing. Overheating of the electronic components and poor system heat dissipation will affect performance, cost and life thereof; therefore, heat dissipation of the electronic components has become a key factor in designing computer system.

Taking the server as an example, existing heat dissipation technologies includes air cooling, liquid cooling and thermoelectric cooling. The air cooling mainly uses fans and specific air duct to blow cool air towards the heat generating components or to draw hot air out of the heat generating components. The liquid cooling mainly includes immersion type and heat pipe type: in the immersion type, the chips are immersed in a cooling liquid (i.e. coolant) of a closed container, the coolant is heated to become steam, the steam flows to a heat sink for heat dissipation through a closed pipe, the heat dissipated steam condenses into the coolant, and the coolant flows back to the closed container; in the heat pipe type, a cooling pipe is arranged on the chip or through heat dissipation fins of the chip, a pump transfers heat absorbed coolant to heat dissipation plate for heat dissipation, and the pump transfers the heat dissipated coolant to the chip to absorb heat again. The thermoelectric cooling mainly uses a cold surface of a thermoelectric cooling (TEC) chip to provide coldness to the server, and then uses the air cooling or the liquid cooling to remove heat of a hot surface of TEC chip.

In the various heat dissipation technologies mentioned above, the immersion type heat dissipation is three-dimensional (space) heat conduction, but installation and operation costs are extremely high; heat dissipation fins and heat pipe heat dissipation are one-dimensional (linear) heat conduction, which may not immediately remove the heat generated by high frequency operation of the chip, easy to cause heat accumulation. TEC chips can theoretically provide a very low temperature cold surface to exchange heat with the heat generating electronic component, so that applications of TEC chips are rapidly growing in markets such as precision temperature control for optical communication, thermal cycling for biomedical and semiconductor process equipment, consumer small refrigerator; however, if the heat of the hot surface of TEC chip is not quickly discharged and flows back to TEC chip, the temperature of the cold surface of TEC chip rises and cannot to meet the coldness for heat dissipation or cooling, if the temperature of the hot surface continuously rises, TEC chip may be damaged.

To develop solutions for the existing problems of heat dissipation of the electronic components is a main aspect of development of the present application.

SUMMARY OF THE INVENTION

In order to achieve the solutions for the existing problems of heat dissipation of the electronic components, the present application provides a device of drawing out surface heat of an electronic component including a housing, a liquid inlet port, a liquid outlet port, a partition wall and flow guiding walls. The housing includes opposite a contact wall and a heat dissipating wall, and a side wall respectively connected to the contact wall and the heat dissipating wall, wherein the contact wall can be disposed on a hot surface of an electronic component, and the heat dissipating wall has fins formed thereon. The liquid inlet port and the liquid outlet port are formed on the side wall. The partition wall is formed in the housing, and connected to inner surfaces of the contact wall, the heat dissipating wall and the side wall, to divide interior of the housing into an inflow channel and an outflow channel, wherein the inflow channel communicates with the liquid inlet port, the outflow channel communicates with the liquid outlet port, and a side of the partition wall away from the liquid inlet port has passages communicating with the inflow channel and the outflow channel. The flow guiding walls are respectively formed in the inflow channel and the outflow channel, and connected to the inner surface of the contact wall.

In an embodiment, the housing is made of metal.

In an embodiment, the fins are spaced apart from each other.

In an embodiment, the liquid inlet port and the liquid outlet port are formed on the same side of the side wall.

In an embodiment, a number of the partition wall is plural, the partition walls further divide the interior of the housing into an intermediate flow channel located between the inflow channel and the outflow channel.

In an embodiment, the flow guiding walls are further formed in the intermediate flow channel.

In an embodiment, the flow guiding walls have protruding strips formed thereon.

In an embodiment, the partition wall has the protruding strips formed thereon.

In an embodiment, the protruding strips are inclined towards the heat dissipating wall or the contact wall.

In an embodiment, the device of drawing out surface heat of the electronic component further includes a heat dissipating pad or a heat dissipating paste, sandwiched between the contact wall and the hot surface.

In the device of drawing out surface heat of the electronic component according to the present application, the contact wall contacts the hot surface of the electronic component, and quickly conducts the heat generated by the electronic component to the flow guiding wall, the partition wall, the side wall and the heat dissipating wall; the partition wall divides the interior of the housing into the inflow channel and outflow channel to increase the heat absorption of the coolant; the flow guiding wall splits the coolant and increases the solid-liquid heat exchange area, to allow the coolant evenly and sufficiently absorb the heat; the fins on the heat dissipating wall of the housing increases the solid-gas heat exchange area, to conduct the remaining heat that is not absorbed by the coolant to the air. By the simultaneous action of the liquid cooling and the air cooling, the device of the present application can quickly discharge the heat generated by the electronic component to the coolant and the air, so as to ensure no heat accumulation occurring in the electronic component, and to maintain the performance and lifetime of the electronic component.

BRIEF DESCRIPTION OF THE DRAWINGS

The invention of the present application will be apparent to those skilled in the art by reading the following detailed description of a preferred embodiment thereof, with reference to the attached drawings, in which.

DETAILED DESCRIPTION OF THE PREFERRED EMBODIMENT

Figure 1A:
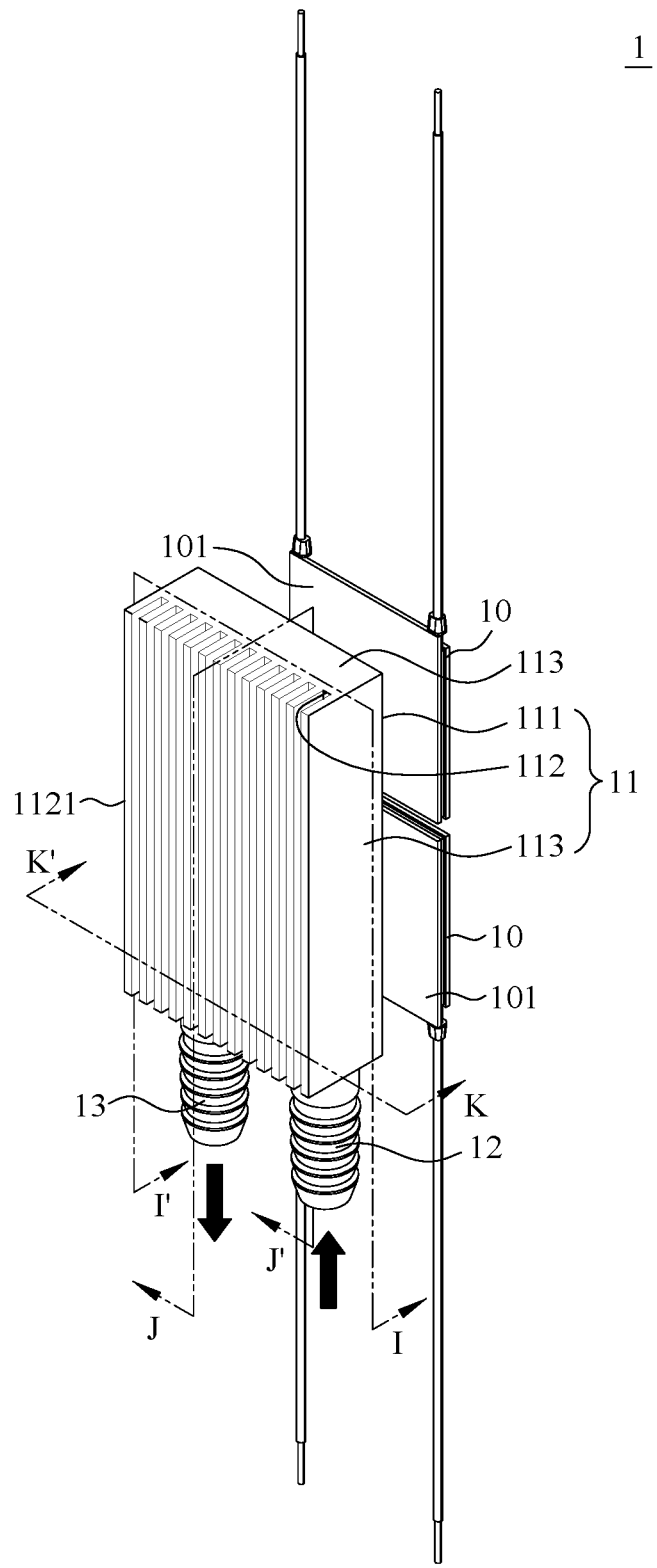
FIG. 1A is a three-dimensional view schematically illustrating the device of drawing out surface heat of the electronic component of an embodiment of the present application.

Hereinafter, the embodiments of the present invention will be described in more detail with reference to the drawings and reference numerals, in order that those skilled in the art can implement the present invention accordingly after studying the present description. The terminology used herein is used to describe particular embodiments only, and is not intended to limit the present invention. Unless it is clearly indicated in the context otherwise, the terms used herein include both singular and plural forms, and the term "and/or" includes any and all combinations of one or more of the associated listed items; the term "connects to" or "communicate with" means that an element connects to or communicates with another element directly or by an intermedia element, and a fluid can pass through the elements (if needed); the term "surface heat" refers to heat generated or conducted by a surface.

Figure 1B:
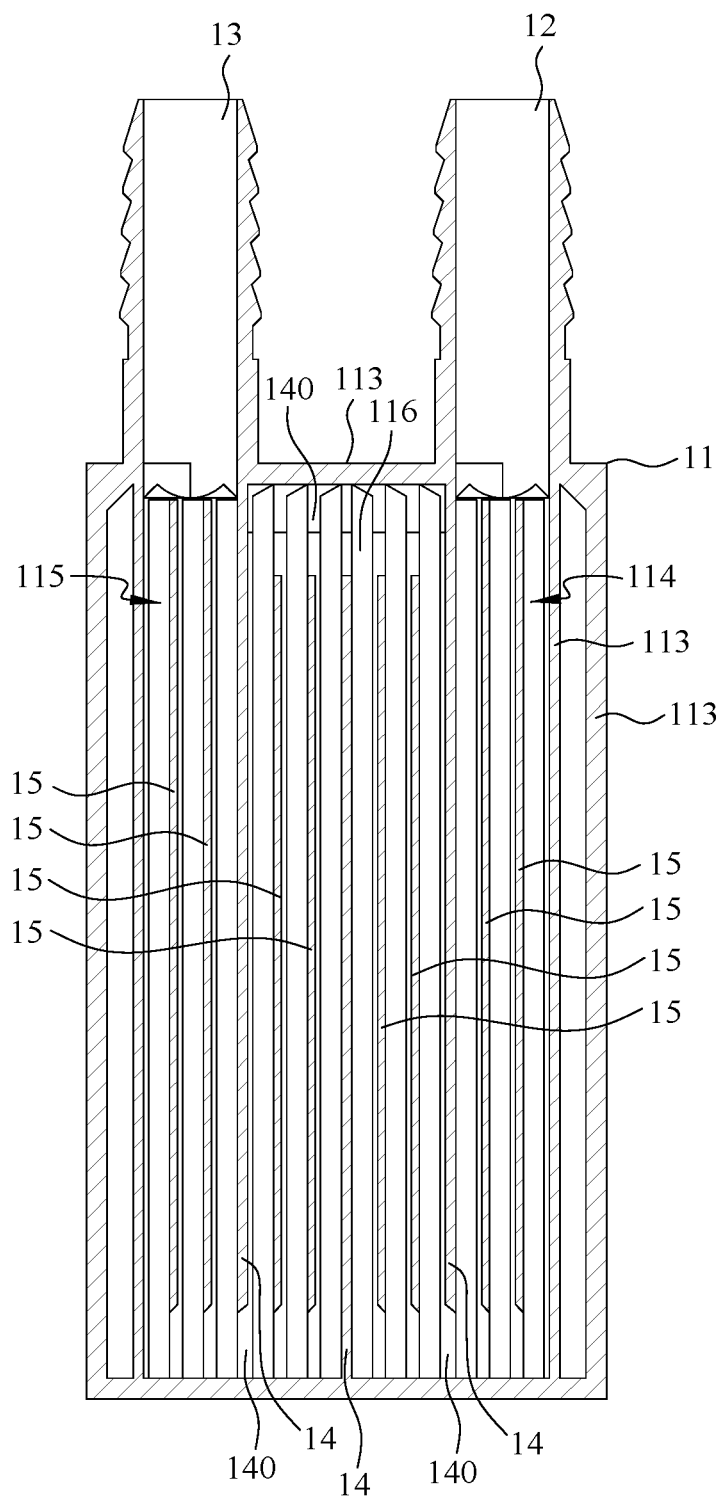
FIG. 1B is a cross-sectional view illustrating I-I' section in FIG. 1A.
Figure 1C:
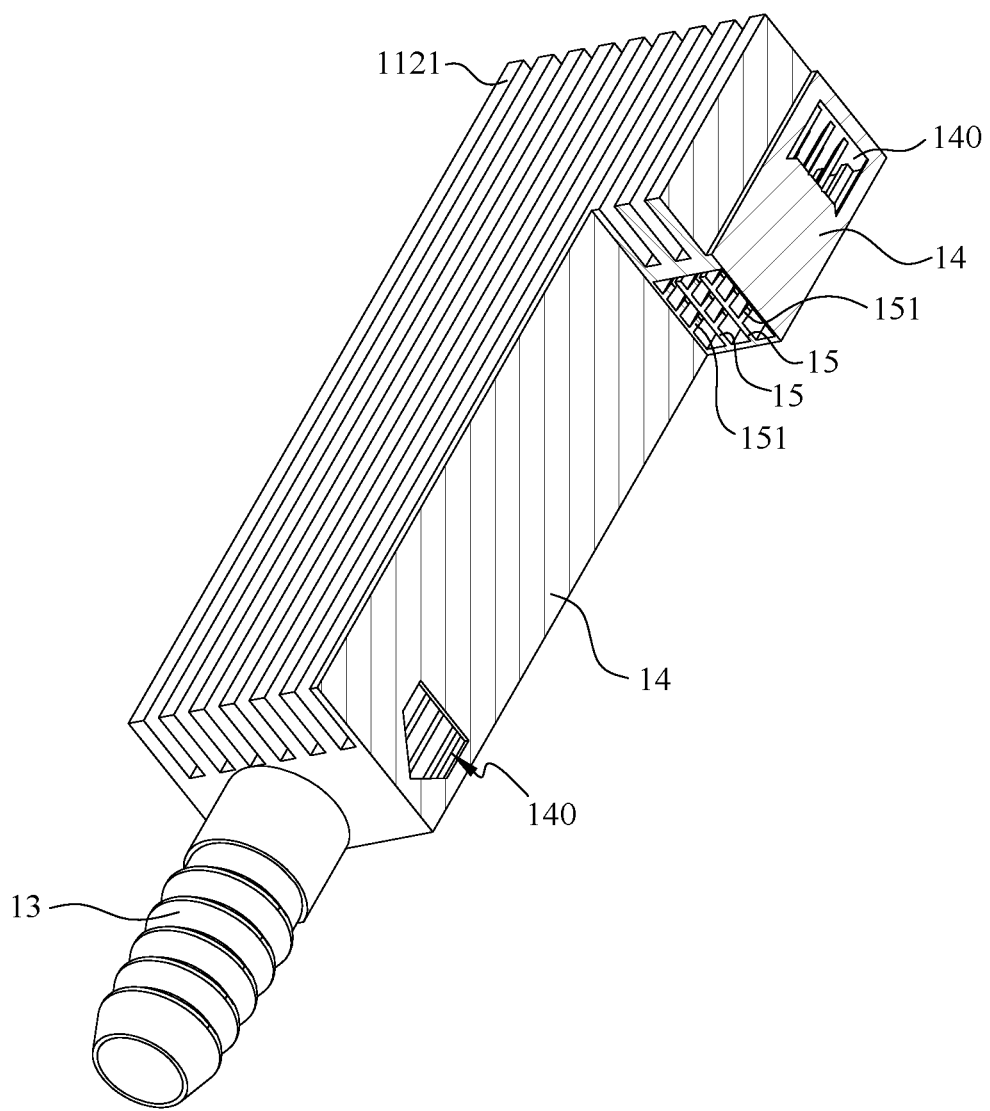
FIG. 1C is a cross-sectional view illustrating J-J' section in FIG. 1A.
Figure 1D:
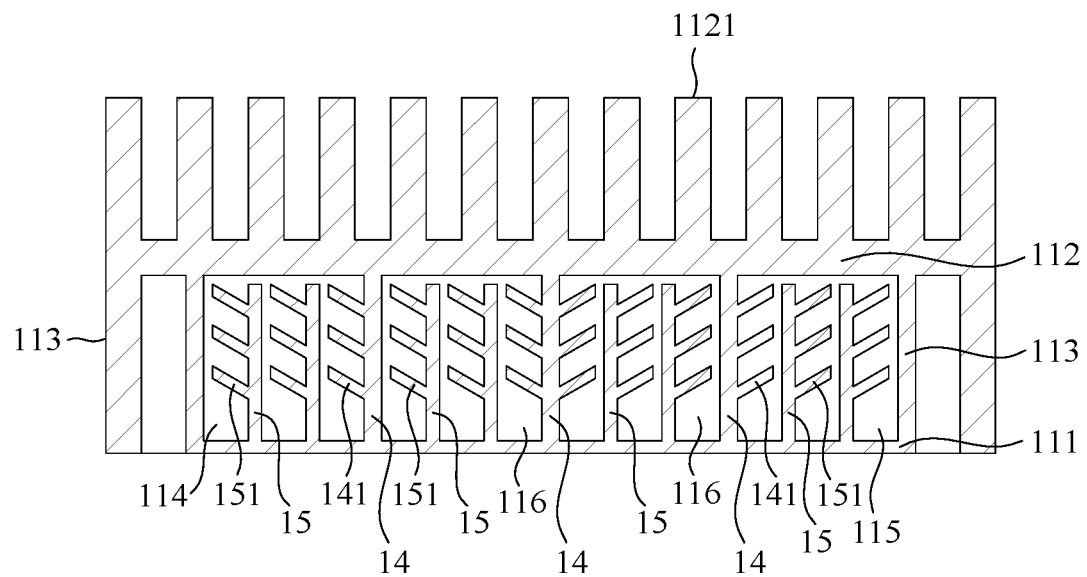
FIG. 1D is a cross-sectional view illustrating K-K' section in FIG. 1A.

FIG. 1A is a three-dimensional view schematically illustrating the device of drawing out surface heat of the electronic component of an embodiment of the present application, FIG. 1B is a cross-sectional view illustrating I-I' section in FIG. 1A. FIG. 1C is a cross-sectional view illustrating J-J' section in FIG. 1A. FIG. 1D is a cross-sectional view illustrating K-K' section in FIG. 1A. As shown in FIG. 1A to FIG. 1D, an electronic component 10 can be TEC chip, the chip in computer, a memory, or other components which generate heat, a device of drawing out surface heat of an electronic component 1 includes: a housing 11, a liquid inlet port 12, a liquid outlet port 13, at least a partition wall 14 and flow guiding walls 15. The housing 11 includes opposite a contact wall 111 and a heat dissipating wall 112, and a side wall 113 respectively connected to the contact wall 111 and the heat dissipating wall 112, wherein the contact wall 111 can be deposed on a hot surface (i.e. heat generating surface) 101 of the electronic element 10, the heat dissipating wall 112 has fins 1121 formed thereon. The liquid inlet port 12 and the liquid outlet port 13 are formed on the side wall 113. The partition wall 14 is formed in the housing 11, and connected to inner surfaces of the contact wall 111, the heat dissipating wall 112 and the side wall 113, to divide an interior of the housing 11 into an inflow channel 114 and an outflow channel 115, wherein the inflow channel 114 communicates with the liquid inlet port 12, the outflow channel 115 communicates with the liquid outlet port 13, and a side of the partition wall 14 away from the liquid inlet port 12 has passages 140 communicating with the inflow channel 114 and the outflow channel 115. The flow guiding walls 15 are respectively formed in the inflow channel 114 and the outflow channel 115, and connected to the inner surface of the contact wall 111.

In this embodiment, each of parts of the device of drawing out surface heat of electronic component 1 can be made of metal materials having high thermal conductivities (for example but not limited to aluminum, copper, aluminum-magnesium alloy, copper alloy); taking aluminum as an example, an aluminum ingot is made into the device of drawing out surface heat of the electronic component 1 through steps of forming with an extruder or die (aluminum extrusion), processing with a computer numerical control (CNC) equipment, welding, and plasma cleaning, and testing the device with high pressure liquid whether the device has an tightness that can withstand the pressure of transferring the coolant. A size of outer surface of the contact wall 111 can be designed according to a size and a number of the corresponding electronic component 10, an area of the outer surface of the contact wall 111 is greater than an area of one or plural (e.g. two, three, four) hot surface(s) 101; the fins 1121 formed on the heat dissipating wall 112 are plate-shaped and spaced apart from each other; the side wall 113 is a rectangular frame, and connected to four sides of the contact wall 111 and four sides of the heat dissipating wall 112 respectively; the liquid inlet port 12 and the liquid outlet port 13 are formed on the same side of the side wall 113. A number of the partition walls 14 is three, the partition walls 14 located on two sides further divide the interior of the housing 11 into an intermediate flow channel 116 located between the inflow channel 114 and the outflow channel 115; the partition wall 14, which divides the inflow channel 114 and the intermediate flow channel 116, has the passage 140 formed on the side away from liquid inlet port 12; the partition wall 14, which is located on the center of the intermediate flow channel 116, has the passage 140 formed on the side adjacent to the liquid inlet port 12; the partition wall 14, which divides the intermediate flow channel 116 and the outflow channel 115, has the passage 140 formed on the side away from liquid inlet port 12. The flow guiding wall 15 are further formed in the intermediate flow channel 116. The partition walls 14 and the flow guiding wall 15 have protruding strips 141, 151 formed there on, and the protruding strips 141,151 are inclined towards the heat dissipating wall 112.

It is worth noting that thermal conductivities of liquids are lower than those of solids, when a flow rate of the coolant is too fast and a residence time in the housing 11 is short, the heat absorbed by the coolant is less; when the flow rate of the coolant is too slow and the residence time in the housing 11 is long, the heat absorbed by the coolant is more, but the heat dissipation rate is poor; therefore, too fast or too slow flow rate of the coolant may reduce the heat conduction rate of the contact wall 111, then cause heat accumulation of the hot surface 101, and raise the temperature of the electronic component 10. In this embodiment, on a cross section perpendicular to the flow direction of the coolant, the cross-sectional areas of the liquid inlet port 12 and the liquid outlet port 13 which the coolant passes through are the same, the cross-sectional areas of the inflow channel 114 and the outflow channel 115 are 90%-99% of those of the liquid inlet port 12 and the liquid outlet port 13, and the cross-sectional area of the passage 140 on the partition wall 14 is 90%-99% of that of the liquid inlet port 12 or the liquid outlet port 13; thereby the coolant flow with both heat absorption and heat dissipation effects is generated.

The thermal conductivities of solids are higher than those of liquids and gases, after the electronic component 10 (e.g. TEC chip) is powered on, the heat generated by the hot surface 10 is conducted to the contact wall 112, the contact wall 111 can quickly conduct the heat to the flow guiding wall 15, the protruding strips 141,151, the partition wall 14, the side wall 113, the heat dissipating wall 112 and the fins 1121 in sequence; the coolant flows into the housing 11 through the liquid inlet port 12, passes through the inflow channel 114, the passages 140, the intermediate flow channel 116 and the outflow channel 115 (i.e. flows along U and inverted U-shaped flow channels in the housing 11) to absorb the heat of the side wall 113, the partition wall 14, the flow guiding wall 13, the protruding strips 141,151, the heat dissipating wall 112 and the fins 1121, and the heat absorbed coolant flows out of the housing 11 through the liquid outlet port 13.

The inflow channel 114 and the outflow channel 115 divided by the partition wall 14 allow the coolant flow through the interior of the housing 11 forth and back to absorb the heat, to add the number of the partition walls 14 and the intermediate flow channel 116 can prolong the residence time of the coolant in the housing 11, so as to increase the heat absorption of the coolant. The flow guiding walls 15 and the protruding strips 141, 151 greatly increase the solid-liquid heat exchange areas, the multi-layered protruding strips 141, 151 of can distribute the coolant to absorb the heat of the partition wall 14, the flow guiding wall 15 and the protruding strips 141,151 without affecting the flow velocity of the coolant, gaps (about 0.1 millimeter to 1.0 millimeter) between the tops of the flow guiding walls 15 and the heat dissipating walls 112 and gaps (about 0.1 millimeter to 1.0 millimeter) between front ends of the protruding strips 141,151 and the side wall 113 allow the split coolant concurrently pass through the differently located flow guiding walls 15 and protruding strips and absorb the heat thereof, so that the coolant evenly and sufficiently absorb the heat in the housing 11.

If the coolant does not fully absorb the heat conducted from the hot surface 101, the remaining heat is conducted to the outside air from the surfaces of the side wall 113, the heat dissipating wall 112 and the fins 1121; the fins 1121 on the heat dissipating wall 112 significantly increases the surface area of the heat dissipation, and the temperature difference between the fins 112 and the air and the space between the fins 112 can cause airflow where the hot air flows out and the cold air flows in, so as to increase heat exchange rate of the air. A fan (not shown) can be arranged on a side of the fins 1121 to force the air passing through the surfaces of the fins 1121 and the space between the fins 1121, so that the effect of the air cooling can be further increased. By the simultaneous action of the liquid cooling and the air cooling, the device of drawing out surface heat of the electronic component 1 can quickly discharge the heat generated by the hot surface 101 to the coolant and the air, so as to ensure no heat accumulation occurring in the electronic component 10, and to maintain the performance and lifetime of the electronic component 10.

If the tightness between the hot surface 101 and the contact wall 111 is insufficient, the air that enters gap between the hot surface 101 and the contact wall 111 affects the heat conduction, the device of drawing out surface heat of electronic component of the present application can further include a heat dissipating pad or a heat dissipating paste (not shown) sandwiched between the contact wall 111 and the hot surface 101, to increase the heat conducting efficiency between the thermal conducting efficiency, the heat dissipating pad or heat dissipating paste (e.g. silver paste, copper paste) contains a component with high thermal conductivity (e.g. carbon fibers, metal particles, graphene).

In other embodiments, the configuration of the fins on the heat dissipating wall 112 can be wave-shaped plates or separately arranged columns; the housing can have single the partition wall formed therein, the liquid inlet port and the liquid outlet port are located on the same side of the side wall, the coolant flows forth and back to absorb the heat along the U-shaped flow channel in the housing; the housing can have two partition walls formed therein, the liquid inlet port and the liquid outlet port are located on opposite two sides of the side wall, the coolant flows into the housing through the liquid inlet port located on one side of the side wall, then flows forth and back along the U and invert U-shaped flow channel in the housing, and flows out of the housing through the liquid outlet port located on the opposite side of the side wall.

Figure 2:
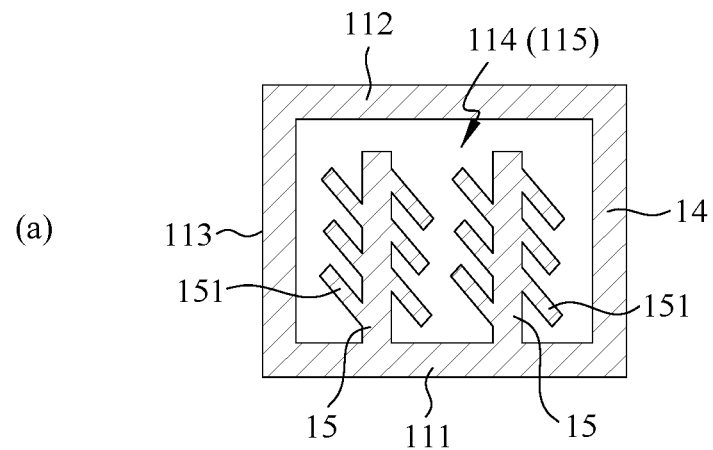
FIG. 2 is a cross-sectional view illustrating the flow channel of coolant of the device of drawing out surface heat of electronic component of another embodiment of the present application.
Figure 2:
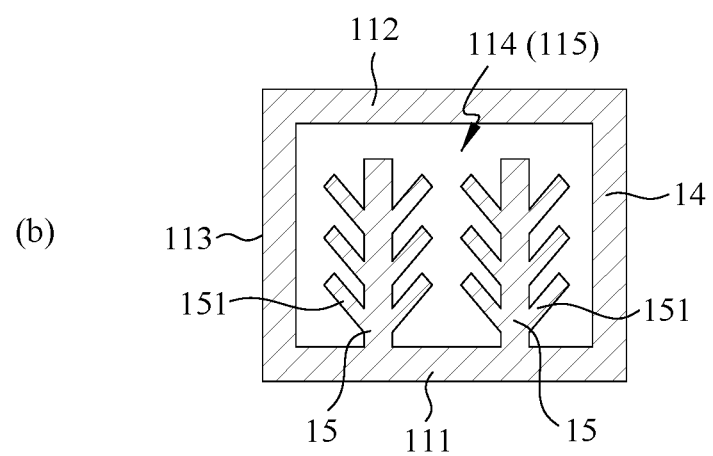

FIG. 2 is a cross-sectional view illustrating the flow channel of coolant of the device of drawing out surface heat of electronic component of another embodiment of the present application. As shown in FIG. 2, the partition wall 14 is connected to the contact wall 111 and the heat dissipating wall 112, the inflow channel 114 (or outflow channel 115) is formed between the partition wall 14 and the side wall 113, the flow guiding wall 15 is formed on the contact wall 111, the protruding strips 151 are formed on two sides of the flow guiding wall 15, the protruding strips 151 on one side are inclined towards the heat dissipating wall 112, the protruding strips 151 on the other side are inclined towards the contact wall 111 (as FIG. 2(*a*)); or the protruding strips are formed on two sides of the flow guiding wall 15, and the protruding strips 151 on the both sides are inclined towards the heat dissipating wall 112 (as FIG. 2(*b*)); various layouts and configurations of the flow guiding walls 15 and the protruding strips 151 can increase the solid-liquid heat exchange area, so that the coolant can evenly and sufficiently absorb the heat conducted by the hot surface of the electronic component.

In summary, in the device of drawing out surface heat of the electronic component according to the present application, the contact wall contacts the hot surface of the electronic component, and quickly conducts the heat generated by the electronic component to the flow guiding wall, the partition wall, the side wall and the heat dissipating wall; the partition wall divides the interior of the housing into the inflow channel and outflow channel to increase the heat absorption of the coolant; the flow guiding wall splits the coolant and increases the solid-liquid heat exchange area, to allow the coolant evenly and sufficiently absorb the heat; the fins on the heat dissipating wall of the housing increases the solid-gas heat exchange area, to conduct the remaining heat that is not absorbed by the coolant to the air. By the simultaneous action of the liquid cooling and the air cooling, the device of the present application can quickly discharge the heat generated by the electronic component to the coolant and the air, so as to ensure no heat accumulation occurring in the electronic component, and to maintain the performance and lifetime of the electronic component.

Although the present invention has been described with reference to the preferred embodiments thereof, it is apparent to those skilled in the art that a variety of modifications, combinations and changes may be made without departing from the scope of the present invention which is intended to be defined by the appended claims.

What is claimed is:

1. A device of drawing out surface heat of an electronic component, comprising:
    a housing, comprising opposite a contact wall and a heat dissipating wall, and a side wall respectively connected to the contact wall and the heat dissipating wall, wherein the contact wall can be disposed on a hot surface of an electronic component, and the heat dissipating wall has fins formed thereon;
    a liquid inlet port and a liquid outlet port, formed on the side wall;
    a partition wall, formed in the housing, and connected to inner surfaces of the contact wall, the heat dissipating wall and the side wall, to divide interior of the housing into an inflow channel and an outflow channel, wherein the inflow channel communicates with the liquid inlet port, the outflow channel communicates with the liquid outlet port, and a side of the partition wall away from the liquid inlet port has passages communicating with the inflow channel and the outflow channel; and
    flow guiding walls, respectively formed in the inflow channel and the outflow channel, and connected to the inner surface of the contact wall.

2. The device of drawing out surface heat of the electronic component according to claim 1, wherein the housing is made of metal.

3. The device of drawing out surface heat of the electronic component according to claim 1, wherein the fins are spaced apart from each other.

4. The device of drawing out surface heat of the electronic component according to claim 1, wherein the liquid inlet port and the liquid outlet port are formed on the same side of the side wall.

5. The device of drawing out surface heat of the electronic component according to claim 1, wherein a number of the partition wall is plural, the partition walls further divide the interior of the housing into an intermediate flow channel located between the inflow channel and the outflow channel.

6. The device of drawing out surface heat of the electronic component according to claim 5, wherein the flow guiding walls are further formed in the intermediate flow channel.

7. The device of drawing out surface heat of the electronic component according to claim 1, wherein the flow guiding walls have protruding strips formed thereon.

8. The device of drawing out surface heat of the electronic component according to claim 7, wherein the partition wall has the protruding strips formed thereon.

9. The device of drawing out surface heat of the electronic component according to claim 8, wherein the protruding strips are inclined towards the heat dissipating wall or the contact wall.

10. The device of drawing out surface heat of the electronic component according to claim 1, further comprising a heat dissipating pad or a heat dissipating paste, sandwiched between the contact wall and the hot surface.

* * * * *